(12) United States Patent
Li et al.

(10) Patent No.: US 9,282,625 B2
(45) Date of Patent: Mar. 8, 2016

(54) PLASMA RESONANT CAVITY

(71) Applicant: YANGTZE OPTICAL FIBRE AND CABLE COMPANY, LTD., Wuhan (CN)

(72) Inventors: Zhenyu Li, Wuhan (CN); Songtao Lu, Wuhan (CN); Shanpei Liu, Wuhan (CN); Shengya Long, Wuhan (CN); Gaoqing Lei, Wuhan (CN); Yongtao Liu, Wuhan (CN)

(73) Assignee: YANGTZE OPTICAL FIBRE AND CABLE COMPANY, LTD., Wuhan (CN)

(*) Notice: Subject to any disclaimer, the term of this patent is extended or adjusted under 35 U.S.C. 154(b) by 713 days.

(21) Appl. No.: 13/647,407

(22) Filed: Oct. 9, 2012

(65) Prior Publication Data
US 2013/0033342 A1 Feb. 7, 2013

Related U.S. Application Data

(63) Continuation-in-part of application No. PCT/CN2010/079322, filed on Dec. 1, 2010.

(30) Foreign Application Priority Data

Apr. 9, 2010 (CN) .......................... 2010 1 0147798

(51) Int. Cl.
H05H 7/18 (2006.01)

(52) U.S. Cl.
CPC .......................................... H05H 7/18 (2013.01)

(58) Field of Classification Search
CPC .................................... H01P 7/00; H01P 7/06
USPC ............................................. 333/227, 99 PL
See application file for complete search history.

(56) References Cited

U.S. PATENT DOCUMENTS 5,349,316 A * 9/1994 Sterns ........................... 333/208

* cited by examiner

Primary Examiner — Stephen E Jones
(74) Attorney, Agent, or Firm — Matthias Scholl, PC; Matthias Scholl

(57) ABSTRACT

A plasma resonant cavity, including a cylindrical resonant cavity casing, cutoff waveguides, and a waveguide inlet circumferentially formed on the cylindrical resonant cavity casing. The cutoff waveguides are arranged at two ends of the cylindrical resonant cavity casing and employ a movable end cover structure. An intermediate through hole is formed on each cutoff waveguide with the movable end cover structure, and a raised round table is arranged on an inner end surface of the cutoff waveguide and configured with the resonant cavity.

18 Claims, 5 Drawing Sheets

PLASMA RESONANT CAVITY

CROSS-REFERENCE TO RELATED APPLICATIONS

This application is a continuation-in-part of International Patent Application No. PCT/CN2010/079322 with an international filing date of Dec. 1, 2010, designating the United States, now pending, and further claims priority benefits to Chinese Patent Application No. 201010147798.4 filed Apr. 9, 2010. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Dr., Suite 1319, Houston, Tex. 77079.

BACKGROUND OF THE INVENTION

1. Field of the Invention

The invention relates to a cylindrical plasma resonant cavity used for manufacturing an optical fiber perform using PCVD (Plasma Chemical Vapor Deposition).

2. Description of the Related Art

PCVD (Plasma Chemical Vapor Deposition), a main process for manufacturing an optical fiber preform, has the characteristics of flexibility and accuracy, and a plasma resonant cavity microwave system is a core part of PCVD processing equipment. The plasma resonant cavity microwave system includes three parts: a plasma resonant cavity, a microwave generator, and a waveguide device. Microwaves generated by the microwave generator are coupled to the plasma resonant cavity through the waveguide device, and the high-frequency microwave energy is transmitted to an area for processing an optical fiber preform through the plasma resonant cavity for finishing the PCVD processing. The match between the plasma resonant cavity and microwave is very important in the process. The mismatching between the two not only affects the coupling effect and causes energy loss, but also easily damages the system device, and also affects the machining precision of the PCVD processing.

The conventional plasma resonant cavity used for manufacture of optical fiber preforms includes two different structure types: a coaxial structure type and a cylindrical structure type. The cylindrical structure type is more suitable for processing large-diameter performs using PCVD. The cylindrical resonant cavity is simple in cavity structure, easy for processing and manufacturing, and excellent in deposition performance. However, most conventional resonant cavities adopt fixed structures, the size of the cavity body is fixed, the requirements of deposition of lining pipes with different sizes cannot be met, and the processing range is greatly limited.

SUMMARY OF THE INVENTION

In view of the above-described problems, it is one objective of the invention to provide a plasma resonant cavity. The plasma resonant cavity is not only simple in structure, easy for processing and excellent in deposition performance, but also can adjust the matching performance of load within a certain range, meet the requirements of deposition of lining pipes with different sizes, and extend the processing range.

To achieve the above objective, in accordance with one embodiment of the invention, there provided is a plasma resonant cavity comprising a cylindrical resonant cavity casing, cutoff waveguides, and a waveguide inlet circumferentially formed on the cylindrical resonant cavity casing, wherein the cutoff waveguides are arranged at two ends of the cylindrical resonant cavity casing and employ a movable end cover structure, an intermediate through hole is formed on each cutoff waveguide with the movable end cover structure, and a raised round table is arranged on an inner end surface of the cutoff waveguide and configured with the resonant cavity.

In a class of this embodiment, the cutoff waveguides with the movable end cover structure at two ends of the resonant cavity casing are symmetrical.

In a class of this embodiment, a connecting hole is formed at the periphery of the end surface of each cutoff waveguide with the movable end surface structure, a screw hole is correspondingly formed at the end of the cylindrical resonant cavity casing, and the movable end cover is fixedly connected with the end of the cylindrical resonant cavity casing through a bolt.

In a class of this embodiment, a cooling water channel is arranged in each cutoff waveguide with the movable end surface structure, and two ends of the cooling water channel are communicated with a cooling water pipeline.

Advantages of the invention are summarized below:

firstly, each cutoff waveguide adopts the movable end surface structure, the inner diameter and length of the cutoff waveguide are adjusted by adjusting the diameter of the intermediate through holes and the axial thickness of the movable end covers, the resonant cavity is matched with glass lining pipes with different diameters within a certain size range, the waveguide device is better matched with the load of the resonant cavity, and the coupling effect is enhanced to adapt to the change of load in the processing process and reduce the energy loss, therefore, the processing range of the cylindrical plasma resonant cavity is extended;

secondly, the cavity structure is simple, and the processing and manufacturing are easy; in the whole cavity body, energy is evenly distributed; the deposition is uniform; the deposition and adhesion effect is good, dust is less, pipes are not clogged, the deposition rate and the deposition efficiency are high, and the processing precision and the processing efficiency of the PCVD process are improved;

thirdly, the service performance is stable, the operational reliability is high, other devices are not involved in the resonant cavity, the phenomenon of electric arc striking and the damage of microwave to the system device can be avoided, so that the effective service life of the plasma resonant cavity microwave system is prolonged; and fourthly, the cooling water channel is arranged in the movable end cover structure of each cutoff waveguide, thus the structure is simple, and the cooling requirements of the resonant cavity in the high temperature environment can be fully met.

DETAILED DESCRIPTION OF THE EMBODIMENTS

Figure 1:
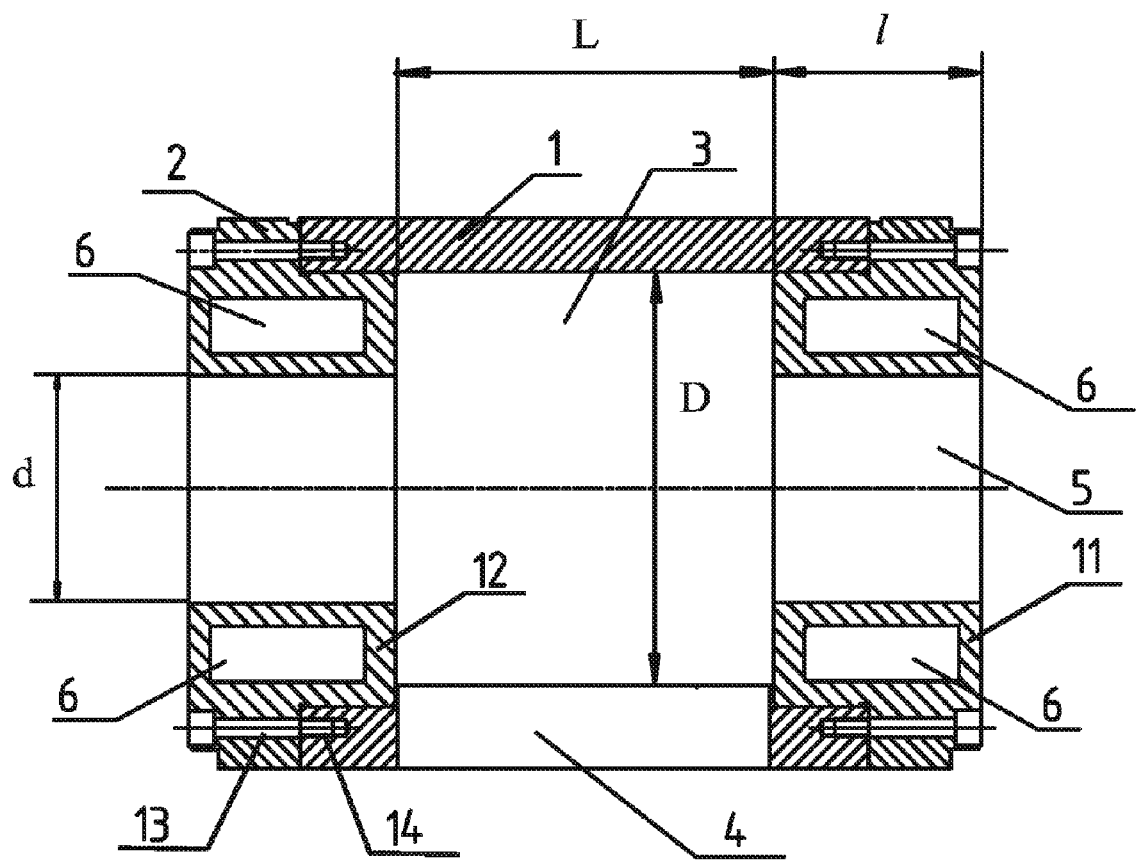
FIG. 1 is a front sectional view of a plasma resonant cavity in accordance with one embodiment of the invention.

A plasma resonant cavity comprises a cylindrical resonant cavity casing 1. The diameter of a cavity body 3 of the resonant cavity is D, the length of the cavity body is L, and a waveguide inlet 4 is circumferentially formed on the cylindrical resonant cavity casing 1 and connected with a waveguide device. Cutoff waveguides 2 with a movable end cover 11 are arranged at two ends of the cylindrical resonant cavity casing 1; an intermediate through hole 5 with a diameter of d is formed on each cutoff waveguide 2 with the movable end cover 11, and a raised round table 12 is arranged on the inner end surface of each cutoff waveguide 2 and configured with the resonant cavity. The distance from the inner end surface of the round table to the outer end surface of the movable end cover 11 refers to the length l of the cutoff waveguide. A connecting hole 13 is formed at the periphery of the end surface of each cutoff waveguide with the movable end surface structure, a screw hole 14 is correspondingly formed at the end of the cylindrical resonant cavity casing, and the movable end cover 11 is fixedly connected with the end of the cylindrical resonant cavity casing through a bolt. The cutoff waveguides (at two ends of the cylindrical resonant cavity casing) with the movable end cover 11 are symmetrical. Thus, a fixed cylindrical plasma resonant cavity capable of detachably exchanging the cutoff waveguides is formed, so that the glass lining pipes with different diameters can be processed within a certain range. In addition, a cooling water channel 6 is arranged in each cutoff waveguide 2 with the movable end cover 11, two ends of the cooling water channel 6 are communicated with a cooling water pipeline, and the whole resonant cavity casing and the cutoff waveguides can be sufficiently cooled through heat conduction. The cross-sectional area of an inlet pipeline or an outlet pipeline of the cooling water channel is 40-50 mm$^2$, and the cross-sectional area of the cooling water channel in the movable end cover 11 is about 270-470 mm$^2$. The water supply pressure of external cooling water is about 3-4 Bar, the flow rate is 2.5-3 m/s, and the cooling water flow is about 6-9 L/min. The temperature difference Δt between a cooling water inlet and a cooling water outlet of the cooling water channel is 28-32° C., and the heat exchange capability is about 12-19 kJ.

The main structure parameters of the plasma resonant cavity are as follows:

(1) As for a glass lining pipe with an outer diameter of about 36 mm, the parameters are as follows:

D=100±5 mm, L=87±2 mm, d=45±2 mm, and l=50±5 mm.

(2) As for a glass lining pipe with an outer diameter of about 47 mm, the parameters are as follows:

D=100±5 mm, L=87±2 mm, d=55±2 mm, and l=50±5 mm.

(3) As for a glass lining pipe with an outer diameter of about 55 mm, the parameters are as follows:

D=100±5 mm, L=87±2 mm, d=65±2 mm, and l=50±5 mm.

(4) As for a glass lining pipe with an outer diameter of about 60 mm, the parameters are as follows:

D=100±5 mm, L=87±2 mm, d=70±2 mm, and l=50-70 mm.

Figure 2:
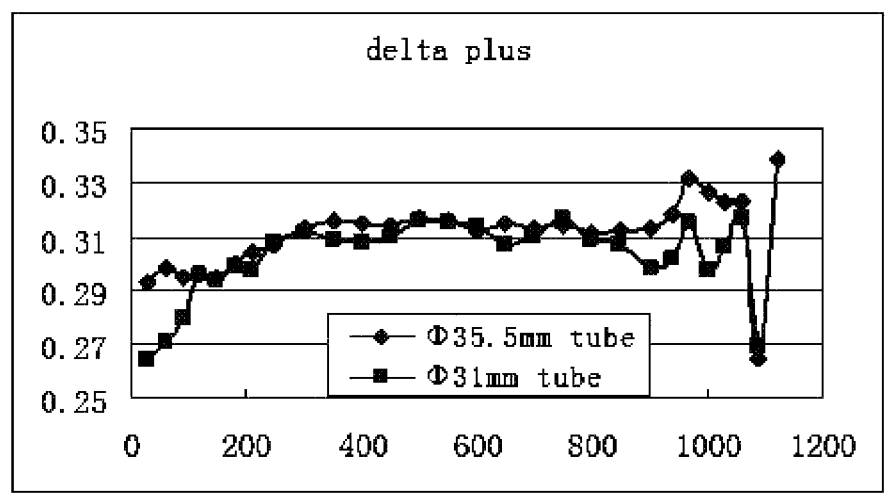
FIG. 2 is a comparison chart of refractive index variation homogeneity of a core layer of a deposited core rod in accordance with one embodiment of the invention.
Figure 3:
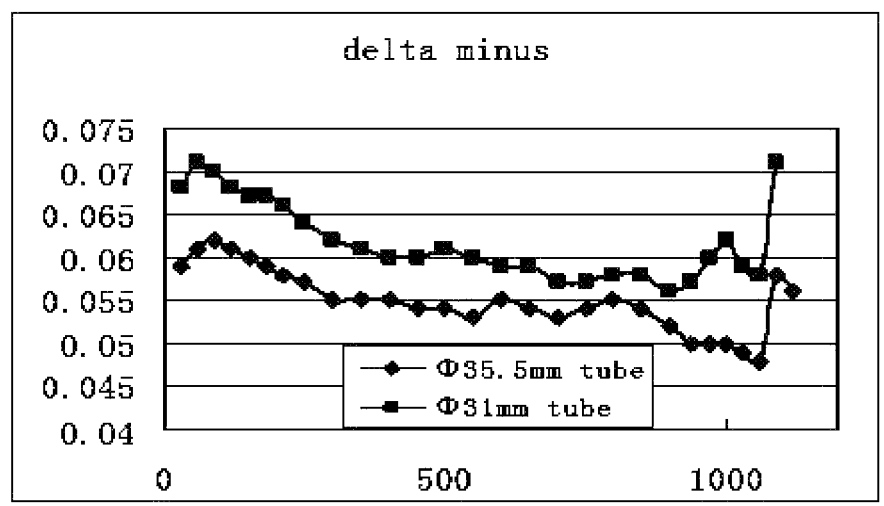
FIG. 3 is a comparison chart of refractive index variation homogeneity of a cladding layer of a deposited core rod in accordance with one embodiment of the invention.
Figure 4:
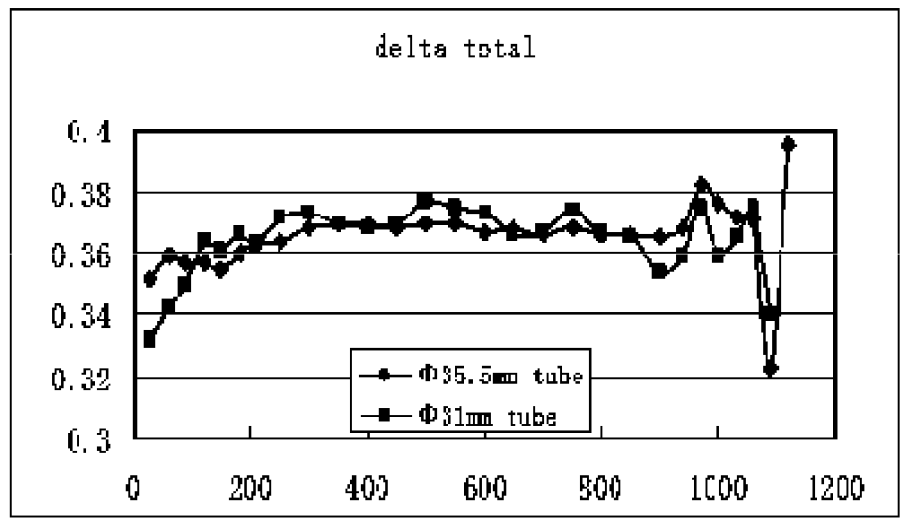
FIG. 4 is a comparison chart of refractive index variation homogeneity of a deposited core rod in accordance with one embodiment of the invention.

As shown in FIGS. 2-4, under the same external conditions, the deposition rate of the core layer of the resonant cavity of the invention is higher than that of other resonant cavities.

Figure 5:
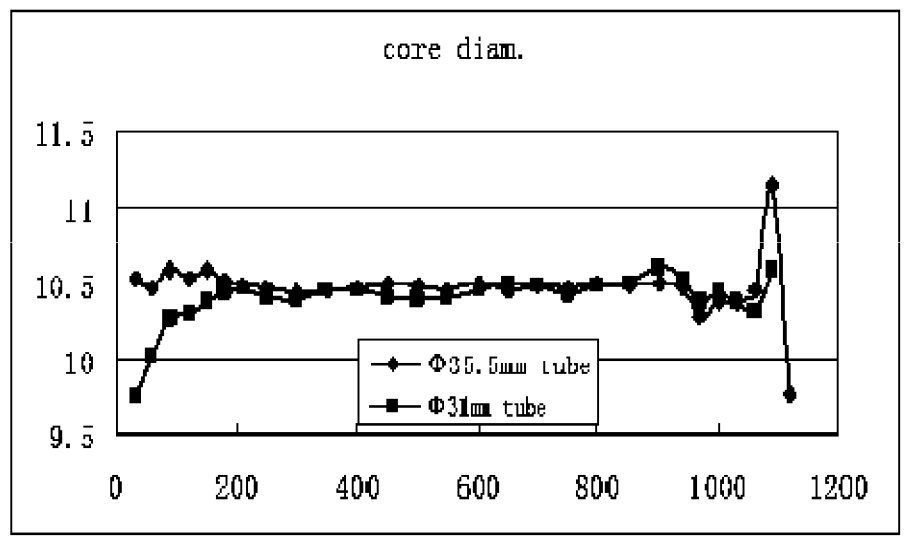
FIG. 5 is a comparison chart of diameter uniformity of a core layer of a deposited core rod in accordance with one embodiment of the invention.

As shown in FIG. 5, in the deposition area with length of 0-200 mm, the deposition effect of the resonant cavity of the invention is better than that of other resonant cavities as far as the indexes of diameter and refractivity are concerned.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A plasma resonant cavity, comprising:
   a cylindrical resonant cavity casing;
   cutoff waveguides; and
   a waveguide inlet circumferentially formed on the cylindrical resonant cavity casing;

wherein:
   the cutoff waveguides are arranged at two ends of the cylindrical resonant cavity casing and each one of the cutoff waveguides comprises a movable end cover;
   an intermediate through hole is formed on each one of the cutoff waveguides; and
   a raised round table is arranged on an inner end surface of each one of the cutoff waveguides and configured with the resonant cavity.

2. The plasma resonant cavity of claim 1, wherein the cutoff waveguides are symmetrical.

3. The plasma resonant cavity of claim 2, wherein
   a connecting hole is formed at a periphery of an end surface of each one of the cutoff waveguides;
   a screw hole is formed at each of the two ends of the cylindrical resonant cavity casing; and
   the movable end cover is fixedly connected with one of the two ends of the cylindrical resonant cavity casing through a bolt.

4. The plasma resonant cavity of claim 3, wherein a cooling water channel is arranged in each one of the cutoff waveguides, and two ends of the cooling water channel are communicated with a cooling water pipeline.

5. The plasma resonant cavity of claim 4, wherein the cross-sectional area of an inlet pipeline or an outlet pipeline of the cooling water channel is 40-50 mm$^2$, and the cross-sectional area of the cooling water channel in each one of the cutoff waveguides is 270-470 mm$^2$.

6. The plasma resonant cavity of claim 4, wherein the water supply pressure of cooling water is about 3-4 Bar, the flow rate is 2.5-3 m/s, the cooling water flow is about 6-9 L/min, and the temperature difference between a cooling water inlet and a cooling water outlet of the cooling water channel is 28-32° C.

7. The plasma resonant cavity of claim 4, having the structure parameters as follows: D=100±5 mm, L=87±2 mm, d=45±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

8. The plasma resonant cavity of claim 4, having the structure parameters as follows: D=100±5 mm, L=87±2 mm, d=55±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

9. The plasma resonant cavity of claim 4, having the structure parameters as follows: D=100±5 mm, L=87±2 mm, d=65±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

10. The plasma resonant cavity of claim 4, having the structure parameters as follows: D=100±5 mm, L=87±2 mm, d=70±2 mm, and l=50-70 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

11. The plasma resonant cavity of claim 1, wherein
a connecting hole is formed at a periphery of an end surface of each one of the cutoff waveguides;
a screw hole is formed at each of the two ends of the cylindrical resonant cavity casing; and
the movable end cover is fixedly connected with one of the two ends of the cylindrical resonant cavity casing through a bolt.

12. The plasma resonant cavity of claim 11, wherein a cooling water channel is arranged in each one of the cutoff waveguides, and two ends of the cooling water channel are communicated with a cooling water pipeline.

13. The plasma resonant cavity of claim 12, wherein the cross-sectional area of an inlet pipeline or an outlet pipeline of the cooling water channel is 40-50 mm$^2$, and the cross-sectional area of the cooling water channel in each one of the cutoff waveguides is 270-470 mm$^2$.

14. The plasma resonant cavity of claim 12, wherein the water supply pressure of cooling water is about 3-4 Bar, the flow rate is 2.5-3 m/s, the cooling water flow is about 6-9 L/min, and the temperature difference between a cooling water inlet and a cooling water outlet of the cooling water channel is 28-32° C.

15. The plasma resonant cavity of claim 12, having the structure parameters as follows: D=100±5 mm, L=87±2 mm, d=45±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

16. The plasma resonant cavity of claim 12, having the structure parameters as follows: D=100±5 mm, L=87±2 mm, d=55±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

17. The plasma resonant cavity of claim 12, having the structure parameters as follows: D=100±5 mm, L=87±2 mm, d=65±2 mm, and l=50±5 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

18. The plasma resonant cavity of claim 12, having the structure parameters as follows: D=100±5 mm, L=87±2 mm, d=70±2 mm, and l=50-70 mm, wherein D represents a diameter of a cavity body of the resonant cavity, L represents a length of the cavity body, d represents a diameter of the intermediate through hole, and l represents a length of each one of the cutoff waveguides which is the distance from an inner end surface of the round table to an outer end surface of the movable end cover.

* * * * *